United States Patent
Tam et al.

(10) Patent No.: US 9,681,032 B1
(45) Date of Patent: Jun. 13, 2017

(54) IMAGER MODULE WITH MOLDED PACKAGING

(71) Applicant: Amazon Technologies, Inc., Seattle, WA (US)

(72) Inventors: Samuel Waising Tam, Daly City, CA (US); Tak Shing Pang, Hong Kong (CN)

(73) Assignee: Amazon Technologies, Inc., Reno, NV (US)

( * ) Notice: Subject to any disclaimer, the term of this patent is extended or adjusted under 35 U.S.C. 154(b) by 54 days.

(21) Appl. No.: 14/660,875

(22) Filed: Mar. 17, 2015

(51) Int. Cl.
*H04N 5/225* (2006.01)

(52) U.S. Cl.
CPC ................................. *H04N 5/2254* (2013.01)

(58) Field of Classification Search
CPC ..................................................... H04N 5/2254
See application file for complete search history.

(56) References Cited

U.S. PATENT DOCUMENTS

| | | | | |
|---|---|---|---|---|
| 7,659,134 B2 * | 2/2010 | Chia | ................. | H01L 27/14618 257/E21.503 |
| 8,144,243 B2 * | 3/2012 | Kang | ................. | H01L 27/14618 348/374 |
| 8,430,579 B2 | 4/2013 | Tam et al. | | |
| 8,564,716 B2 * | 10/2013 | Kim | ..................... | H04N 5/2253 257/433 |
| 8,606,057 B1 | 12/2013 | Rudmann | | |
| 8,717,487 B2 * | 5/2014 | Azuma | ................ | H04N 5/2254 348/208.7 |
| 2005/0263312 A1 | 12/2005 | Bolken | | |
| 2007/0183773 A1 | 8/2007 | Aoki | | |
| 2007/0210246 A1 | 9/2007 | Ellenberger | | |
| 2008/0157250 A1 | 7/2008 | Yang | | |
| 2008/0265134 A1 | 10/2008 | Kinoshita | | |
| 2010/0253834 A1 | 10/2010 | Ogane | | |
| 2011/0298119 A1 | 12/2011 | Cho | | |
| 2013/0120861 A1 * | 5/2013 | Park | ....................... | G02B 15/14 359/824 |
| 2013/0128106 A1 | 5/2013 | Tam | | |
| 2013/0272649 A1 | 10/2013 | Braunisch | | |

(Continued)

FOREIGN PATENT DOCUMENTS

CN         103576420 A        2/2014

*Primary Examiner* — Padma Haliyur
(74) *Attorney, Agent, or Firm* — Eversheds Sutherland (US) LLP

(57) ABSTRACT

An imager assembly having a molded package formed using a molded interconnect device (MID) technique having a rim portion protruding from a surface of the molded package is disclosed. A lens may be held by the rim portion protruding from the surface and an image sensor may be disposed on the surface. The molded package may further be mechanically and electrically coupled to an electromechanical device, such as a voice coil motor (VCM). The VCM may be configured to move the lens held by the molded package for the purposes of focusing an image on the image sensor. Additionally, an imager assembly with a sandwich molded package having a first high density interconnect (HDI) layer and a second HDI layer with surface mount devices (SMDs) and molding compound therebetween is disclosed. The imager assembly may further include an image sensor, lens assembly, and VCM disposed on the sandwich molded package.

20 Claims, 12 Drawing Sheets

(56) References Cited

U.S. PATENT DOCUMENTS

2013/0320471 A1   12/2013   Luan
2014/0063302 A1   3/2014   Shukla
2014/0293124 A1   10/2014   Chen
2015/0115422 A1   4/2015   Jeon \* cited by examiner

IMAGER MODULE WITH MOLDED PACKAGING

BACKGROUND

Imaging systems with semiconductor image sensors (e.g., charge coupled device (CCD) image sensors, complementary metal oxide semiconductor (CMOS) image sensors, etc.) may be incorporated in user devices such as smartphones and tablet computing devices. Often times, the form factor of these user devices are aggressively designed. Therefore, the volume of space available for imaging systems within these user devices may be limited. Furthermore, these types of user devices may be subject to vibration and/or mechanical shock (e.g., a user drops his/her smartphone with an imaging system).

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items; however, various embodiments may utilize elements and/or components other than those illustrated in the figures.

DETAILED DESCRIPTION

Overview

Figure 1:
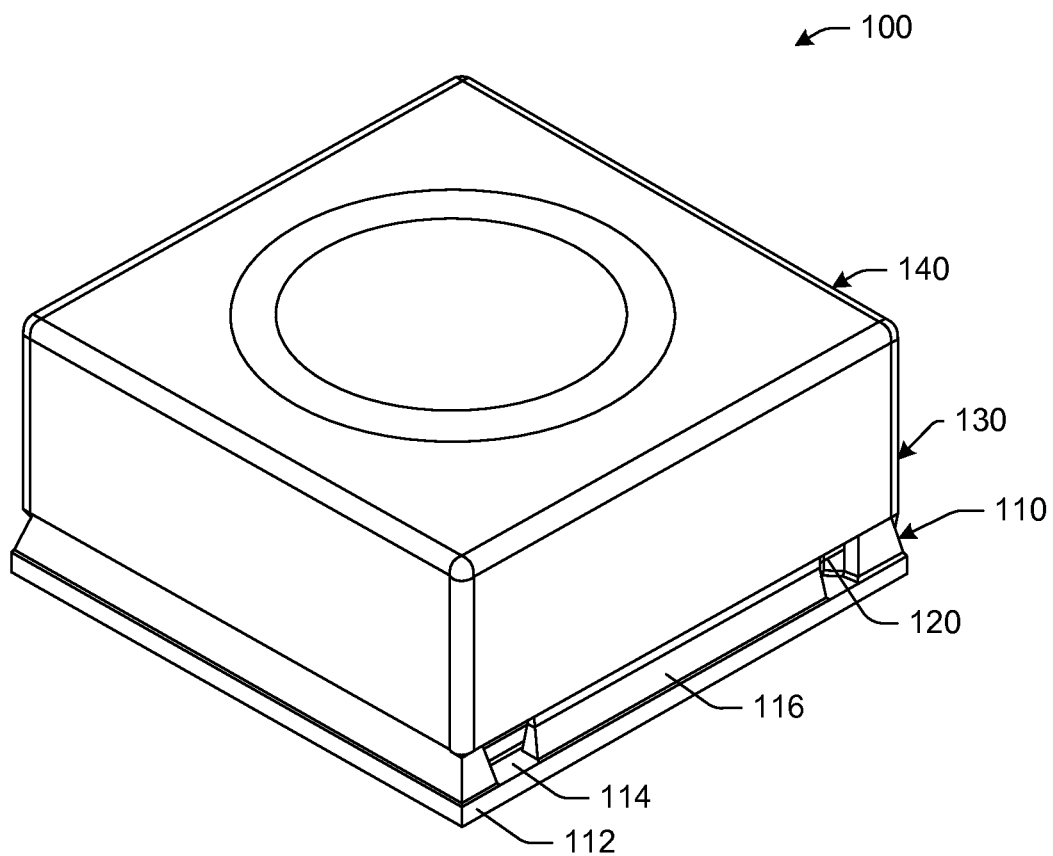
FIG. 1 is a schematic diagram illustrating a top perspective view of an example imager assembly with a molded package, in accordance with example embodiments of the disclosure.

Example embodiments of the present disclosure are directed to, among other things, an imager module for capturing digital images. In example embodiments, the imager assembly may have a relatively compact form factor with the package formed as a molded interconnect device (MID) packaging, such as a molded electronics substrate for electronics packaging. The MID package may be formed with electrical contacts on only one side in example embodiments, or in other example embodiments, the MID package may have electrical contacts on two sides. The imager assembly may have an image sensor mounted on to and electrically coupled to the MID package. In example embodiments, the image sensor may be attached to the MID package using wire bond or any other suitable mechanism. The MID package may further be configured to hold a lens or collection of optical elements on the MID package itself, rather than on a separate lens assembly. The lens may allow light, from a scene to be imaged, to pass to the image sensor disposed on the MID package. The MID package, in example embodiments, may still further have a voice coil motor (VCM) mounted thereon and electrically connected to the MID package to control the position of the lens relative to the image sensor to provide a mechanism for focusing the light impinging on the image sensor. The imager assembly may further be configured to be attached to a printed circuit board (PCB) to form an imager module that may be disposed in a user device, such as a mobile phone or a tablet computing device. The MID package, therefore, by incorporating the lens thereon, may enable a smaller form factor (e.g., reduced height, reduced area, or both reduced area and reduced height) compared to an imager module where the lens is not integrated with the package substrate. In some example embodiments, a cavity may be formed within the MID package, within which the image sensor may be disposed. This cavity, therefore, may further reduce the form factor, and particularly the height of the imager assembly compared to had the cavity not been provided.

According to another example embodiment of the disclosure, a sandwich molded (SM) packaging substrate may be formed using a first high density interconnect (HDI) tape with metallic interconnects, a second HDI tape with metallic interconnects, surface mount technology (SMT) devices disposed between the first HDI tape and the second HDI tape, through electrical connections from the first HDI tape to the second HDI tape, and molding material (e.g., thermoplastic, thermosetting plastic, etc.) disposed between the first HDI tape and the second HDI tape. The SM package, in example embodiments, may be incorporated into an imager assembly by further having an image sensor disposed thereon, along with a VCM or other electromechanical device to displace the lens for the purpose of focus and/or autofocus. The SM package, in example embodiments, may have all of the imager module SMT devices (e.g., active devices, passive devices, electrically programmable read only memories (EPROMs), gyroscopes, accelerometers, micro-electromechanical devices (MEMS), microcontrollers, etc.) incorporated within the sandwich of the SM package. As a result, all or a substantial portion of the functionality of the imager module may be integrated within the SM package-base imager assembly. The SM packaging substrate, in example embodiments, may be attached directly onto a main board of a user device (e.g., smartphone, notebook computer, wearable device, etc.) in which the imager assembly is to be disposed. By having a highly integrated package using the SM package, thereby avoiding a daughter board or a imager module board, reduced costs and/or reduced form factors may be realized for the user device in which the SM package based imager assembly is to be incorporated.

This brief introduction, including section titles and corresponding summaries, is provided for the reader's convenience and is not intended to limit the scope of the claims nor the preceding sections. Furthermore, the techniques described above and below may be implemented in a number of ways and in a number of contexts. Several example implementations and contexts are provided with reference to the following figures, as described below in more detail. However, the following implementations and contexts are but a few of many.

FIG. 1 is a schematic diagram illustrating a top perspective view of an example imager assembly 100 with a molded package 110, in accordance with example embodiments of the disclosure. The molded package 110, or molded electronics subastrate, in example embodiments, may be a molded interconnect device (MID) package 110 and configured to be electrically connected onto a PCB or user device motherboard (not shown). The MID package may have a first side 114 from which a rim portion 116 may protrude. The MID package 110 may further have a lens 120 disposed thereon and held by the rim portion 116 of the MID package 110. In example embodiments, the lens 120 may rest against the rim portion 116 and be movable for the purpose of focusing an image by the imager assembly 100. In further example embodiments, the lens 120 may sit on a ledge or notch provided on inner walls of the rim portion 116 of the molded package 110. As such, there may not be a separate lens holder for holding the lens in this imager assembly 110. The MID package 110 may still further have a voice coil motor (VCM) 130 or other electromechanical device disposed thereon, such as on top of the rim portion 116 of the MID package 110 to provide focusing capability for the imager assembly 100.

The molded package 110 may be fabricated using molded interconnect device (MID) or laser direct structuring (LDS) mechanism. This fabrication mechanism may use metal impregnated thermoplastic materials (e.g., thermoplastic material doped with a metal-plastic additive that can be activated by impingent laser radiation) that are suitable for injection molding. Any suitable forming and/or fabrication mechanism, such as injection molding, may be used to form the structure of the molded package 110. After the injection molding process, or other suitable mechanism of forming the structure of the molded package 110 is performed, a laser may be used to write the course of electrical traces on the molded package 110. The surface portions of the injection molded part that have laser light impingent thereon may be micro-roughened, partially ablated, or otherwise have the metal-plastic dopants activated. The laser activation process may be a physical-chemical process that may form metallic nucleation sites on the surface of the injection molded part on the portions written by the laser. Next a metal plating process, such as a reductive plating process may be initiated. The metallic plating may occur only in the portions of the surface of the injection molded part that has been activated such that there are plating nucleation sites. As a non-limiting example, electroless Cu plating may be used to form the intended traces and bond pads of the molded package 110. Other plating materials and/or chemical baths may include Sn, Ag, Pd/Au, etc. The surface roughening due to the laser activation may further result in enhance the adhesion strength of the plated metal on the doped thermoplastic molded package 110. Therefore, the circuitry (e.g. traces and bond pads) of the molded package 110 may be written by a laser on to the surface of the injection molded intermediary part (e.g., intermediary molded package).

This mechanism for forming the molded package 110 using MID/LDS may provide for a relatively high level of flexibility in the package design and features thereon, as well as relatively low costs compared to other mechanisms for forming electrical packages. Indeed, the rim portion 116 of the molded package 110 may be formed by a relatively robust injection molding process using this mechanism. The incorporation of a suitably designed rim portion 116 may enable the incorporation of the lens 120 right on the molded package 110, rather than a separate lens holder assembly. Therefore, the molded package formed using the MID/LDS processes may provide relatively greater mechanical functionality along with electrical functionality, compared to other mechanisms of forming a packaging substrate, such as, for example, using FR-4 substrate.

Figure 2:
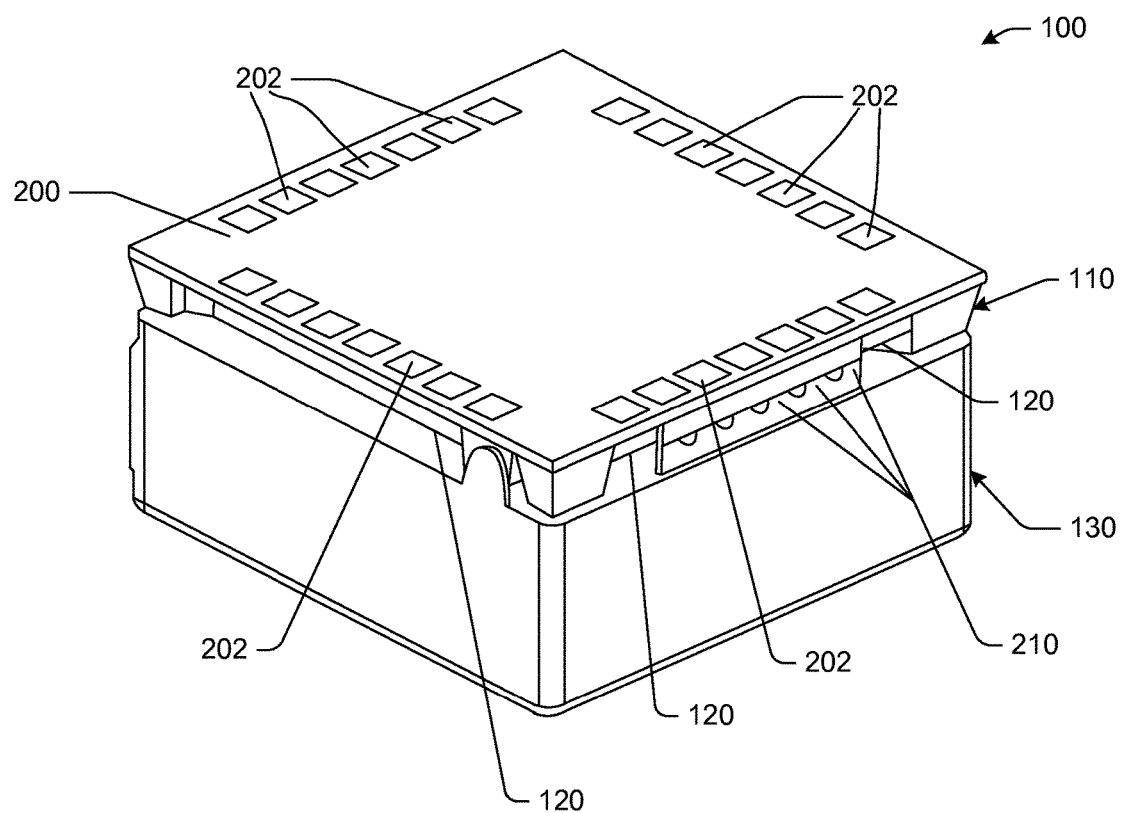
FIG. 2 is a schematic diagram illustrating a bottom perspective view of the example imager assembly with the molded package of FIG. 1, in accordance with example embodiments of the disclosure.

FIG. 2 is a schematic diagram illustrating a bottom perspective view of the example imager assembly 100 with the molded package 110 of FIG. 1, in accordance with example embodiments of the disclosure. The MID package 110 may have a second side 200 with one or more electrical bond pads 202 disposed thereon. Here, the bond pads 202 are depicted along the edge of the second side 200 of the MID package 110, but the bond pads 202 may be disposed at any suitable location on the second side 200 of the MID package 110. The bond pads 202 may be configured to make electrical contact to a PCB or motherboard of a user device in which the imager assembly 100 is to be provided. The bond pads 202 may be configured to make any suitable connection to a PCB, such as flip chip, anisotropic conductive paste (ACP), non-conductive paste (NCP), Au/Au bonds, solder bonds, combinations thereof, or the like. The bond pads 202 may provide the function of communicating electrical signals, such as image sensor signals (e.g., image sensor data), image sensor control signals (e.g., signal to capture an image), VCM control signals, other SMT control signals, to and/or from the imager module 100. For example, the bond pads 202 connected to interconnects on the MID package 110, may be configured to fan out and provide signals/data from an image sensor to an application processor of a user device in which the imager assembly 100 is disposed and operational. In other words, the bond pads may serve as a conduit via which the imager assembly 100 may be configured to communicate with any variety of control or other devices off-module from the imager assembly, including at least image sensor signals, VCM signals, or the like.

In example embodiments, the VCM 130 may have electrical contacts 210 that may make contact to corresponding electrical contacts on the first side 114 of the MID package 110. These electrical contacts 210 of the VCM 130 may be conduits by which electrical control signals may be provided to the VCM via a control device (e.g., applications processor of a user device), the bond pads 202, electrical traces of the MID package 110, and bond pads on the first side 114 of the MID package 110. The electrical control signals to the VCM 130 or VCM control signals may control the VCM 130 to deflect or move the lens 120 to provide focusing capability to the imager assembly 100. It will be appreciated that while the lens 120 autofocus is described with relation to the VCM 130, any suitable electromechanical device that may be used to displace the lens 120 may be used. Other electromechanical devices may include piezomotors, MEMS based deflectors, or the like.

Figure 3:
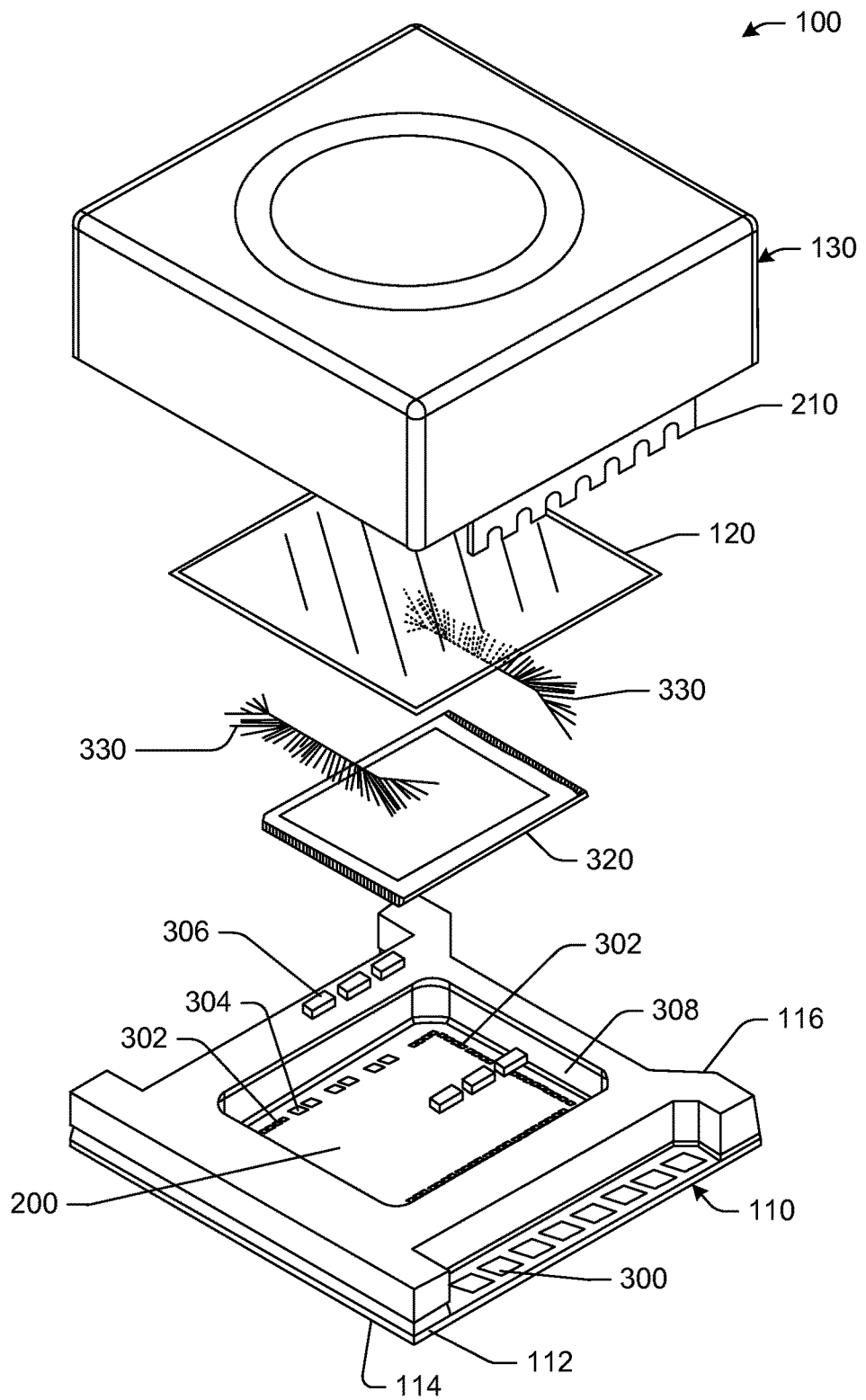
FIG. 3 is a schematic diagram illustrating an exploded perspective view of the example imager assembly with the molded package of FIGS. 1 and 2, in accordance with example embodiments of the disclosure.

FIG. 3 is a schematic diagram illustrating an exploded perspective view of the example imager assembly 100 with the molded package 110 of FIGS. 1 and 2, in accordance with example embodiments of the disclosure. The MID package 110 may have bond pads 300 near its outer edges, such as outside of the rim portion 116 of the MID package 110, where the electrical contacts 210 of the VCM 130 are to contact. The bond pads 300 may be the conduit for providing control signals to the VCM 130 and/or receiving status signals (e.g., signals corresponding to lens displacement, such as a Hall effect-based displacement sensor). The MID package 110 may further have a number of bond pads 302, 304 within the rim portion 116 of the MID package 110.

The bond pads 302, 304 may be used to attach surface mount devices (SMDs) 306 to the MID package 110, such as by, such as by using screen printed solder paste, ACP, NCP, or any other suitable surface mounting technology. The SMD devices 306 may be any suitable device, such as active devices, passive devices, controllers, MEMS devices, memory devices, combinations thereof, or the like. In other words, one or more SMDs 306 may be electrically and mechanically attached to the first surface 114 of the molded package 110, in example embodiments, such as by surface mount technology (SMT). In other example embodiments, SMDs 306 may further be attached to the second side of the MID package 110. These components may be attached to the molded package 110 using any suitable surface mount mechanism, such as pick-and-place with thermo-compression solder joints or thermo-sonic gold-to-gold (Au/Au) bonding. In the embodiments where SMT is performed on the molded package 110, the molded package 110 may, in some cases, have additional protective molding thereon for protecting the SMDs 306. The molding may be made of thermosetting polymer materials, in example embodiments. In other example embodiments, the molded package 110 may not have any SMDs 306 thereon, and instead, one or more SMDs may be provided on a substrate (e.g., PCB) to which the imager assembly 100 is to be disposed. In these example embodiments, the processes performed on the molded package 110 may be fewer than the processes if the SMDs 306 are directly provided on the molded package 110.

The bond pads 302, 304 may further be used to attach an image sensor 320 to the MID package 110. The image sensor 320 may be attached using wire bond, using wires 330 to the MID package 110. The image sensor 320 may be electrically and mechanically connected to the molded package 110 on that first side 114, as shown. Alternatively, the image sensor 320 may be electrically and mechanically attached to the MID package 110 by any other suitable mechanism, such as flip-chip, ACP, NCP, Au/Au bonds, or the like. The image sensor 320 may be of any suitable type, such as active-pixel, charge coupled device (CCD), complementary metal-oxide-semiconductor (CMOS), or the like. The image sensor 320 may be of any suitable pixel count and/or aspect ratio. For example, the image sensor 320 may have an aspect ratio of 4:3 and have 13 million pixels (Megapixels). When an image is captured by the image sensor 320, an image signal corresponding to the captured image may be generated. This image signal may represent the intensity and/or color of each of the pixels of the captured image. Each of the pixels of the captured image may correspond to photosensitive pixels of the image sensor 320 in an active region of the image sensor 320. Light from the scene to be imaged may pass through the lens 120 to impinge upon the photosensitive pixels of the image sensor 320.

In some example embodiments, the molded package 110 may have interconnects (e.g., metallic traces) thereon for routing electrical signals, such as electrical signals to/from a PCB to which the imager assembly 100 is disposed to the various bond pads 202, 300, 302, 304 of the molded package 110 and then ultimately to/from, the image sensor 320, the VCM 130, and/or SMDs 306 may be disposed on the molded package 110. Thus, the molded package 110 may have one or more levels of metallic interconnects on one or both sides of the molded package 110. The interconnect metal traces and/or vias on one or both of the sides of the molded package 110 may be fabricated as part of the molded interconnect device (MID) or laser direct structuring (LDS) technology (e.g., injection molding, laser scribe, and electroless plating). Alternatively, any other suitable processes and any suitable materials may be used to fabricate the molded package 110 with bond pads, 202, 300, 302, 304, metallic traces (e.g., fan out metallic lines), and structure for holding the image sensor 320 and the lens and mating with the VCM 130. The metallic traces may route electrical signals, to enable various functionality of the imager assembly 100. In example embodiments, there may be only a single layer of metal traces on each side 112, 200 of the molded package 110. In further example embodiments, the metallic traces may be used to route signals from the first side 112 to the second side 200, or vice-versa, of the molded package 110, such as by using wrap-around traces. Such wrap-around electrical traces may provide wrap-around peripheral connections between the two sides 112, 200. By using wrap-around peripheral connections, bond pads 300, 302, 304 on the first side 112 may be enabled along with bond pads 202 on the second side 200 of the molded package 110. In other example embodiments, vias may be created in the molded package 110, such as during the injection molding process, to route signals from the first side 112 to the second side 200, or vice-versa, using the vias. The vias, in example embodiments, may be through holes extending form the first side 112 to the second side 200 with metallization within the hole.

Figure 4:
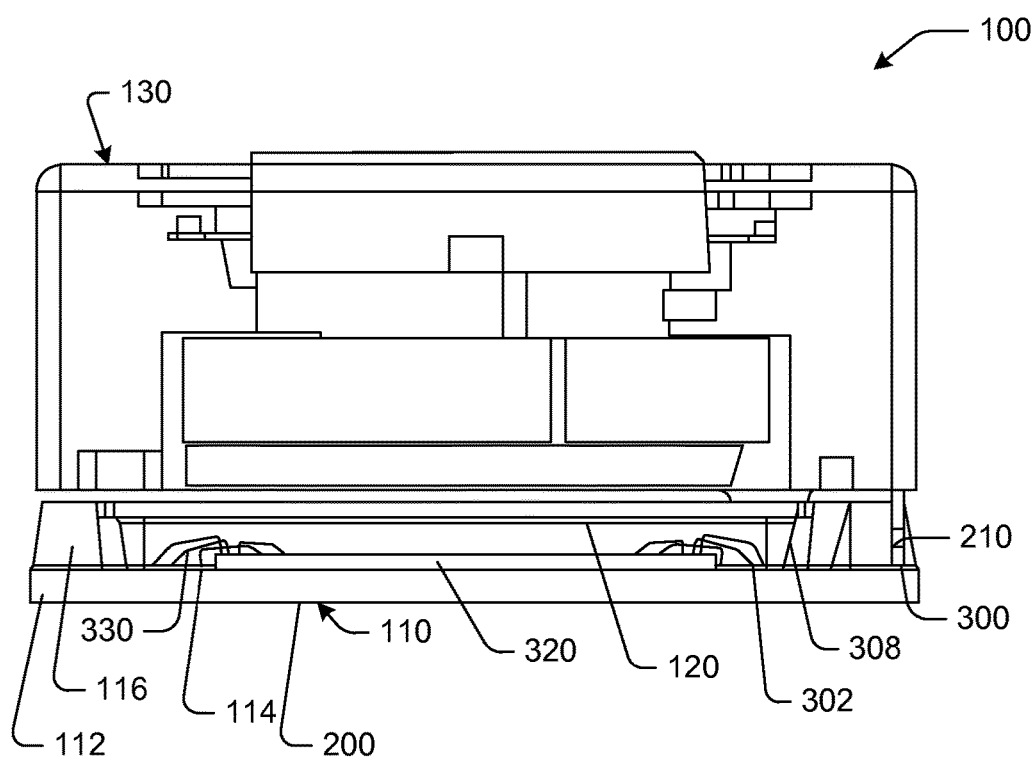
FIG. 4 is a schematic diagram illustrating a sectional view of the example imager assembly of FIGS. 1 and 2, in accordance with example embodiments of the disclosure.

FIG. 4 is a schematic diagram illustrating a sectional view of the example imager assembly 100 of FIGS. 1 and 2, in accordance with example embodiments of the disclosure. As shown, the imager assembly 110, may have the VCM 130 or any other suitable electromechanical device disposed on top of the molded package 110 and the lens 120. The electrical contacts 210 of the VCM 210 may make contact to corresponding bond pads 300 of the molded package 110 to communicate electrical signals (e.g., VCM control signals, VCM displacement status signals, Hall sensor signals, etc.) between the VCM 130 and the molded package 110.

The sidewall 308 of the rim portion 116 of the molded package 110 may have a suitable taper (e.g., angle relative to the base portion 112 of the molded package 110) to enable to the lens 120 to be held along the sidewall 308. In example embodiments, the sidewall 308 may be beveled, chamfered, ledged (e.g., having a protruding ledge), notched (e.g., having a notch) to enable the lens 120 to be held by the rim portion 116 of the molded package 110. In this configuration, the lens 120 may still be configured to move up or down (e.g., closer or further from the image sensor 320, as actuated by the VCM 130. It will be appreciated that in example embodiments, by having the lens 120 configured to be held by the molded package 120, a lens assembly may be not be necessary in this imager assembly 100. This may result in a more compact, lower cost, simpler, and/or reliable imager assembly 100 design.

The wire bonds 330 between the image sensor 320 and the corresponding bond pads 302 may, in example embodiments be low-profile wire bonds to allow for a reduced profile (e.g., height) of the overall imager assembly 100. In some example embodiments, the wire bonds 330 between the molded package 110 and the image sensor 320 may be a single tier. In other example embodiments, the wire bonds 330 between the molded package 110 and image sensor 320 may be multi-tier (e.g., double tiered, triple tiered, etc.).

As a non-limiting example, the wire bonds 330 may have a total loop height of approximately 6 mils (0.16 millimeters (mm)). It will be appreciated that the wire bonds 330 may be any suitable loop height and not limited to the examples discussed herein. As another non-limiting example, a thickness of the base portion 112 (e.g., the distance between the first side 114 and the second side 200) of the molded package 110 may be approximately 0.20 mm. It will be appreciated that the base portion 112 of the molded package 110 may be any suitable thickness and not limited to the examples discussed herein. As a further non-limiting example, the base 112 of the molded package 110 may have a length and/or width between approximately 5 mm and approximately 20 mm, and in some cases, between approximately 10 mm and approximately 11 mm. It will be appreciated that the length and/or width of the molded package 110 may be any suitable length and/or height and not limited to the examples discussed herein. In yet a further non-limiting example, the total height of the imager assembly 100 may be between approximately 3.5 mm and approximately 8 mm, and in some cases, between approximately 5 mm and approximately 6 mm. It will be appreciated that the height of the imager assembly 100 may be any suitable height and not limited to the examples discussed herein. In another non-limiting example, the sidewall 308 of the rim portion 116 may have an angle (e.g., relative to the base portion 112 of the molded package 110) of between approximately 30 degrees to approximately 80 degrees, and in some cases, between approximately 50 degrees and 70 degrees. It will be appreciated that the sidewall angle of the rim portion 116 may be any suitable angle and not limited to the examples discussed herein.

As mentioned above, the imager module 100 may be attached to a PCB or flexible printed circuit (FPC) made of any suitable material, such as FR-4, laminate, polyimide, or other electrical substrate materials. The PCB, in example embodiments, may be configured to provide electrical signals to and from the imager assembly 100, such as via electrical contacts and bond pads. For example, the PCB may be configured to receive and/or send electrical signals from and/or to processor(s) of a user device in which the imager assembly 100 may be disposed. The PCB may be connected to one or more other PCBs, such as a main board or mother board of the user device, such as a smartphone, tablet computing device, laptop computer, wearable device, or the like. The PCB may be electrically connected to other electrical boards and/or devices via the electrical contacts by any suitable mechanism, such as solder connections, ribbon connectors, and/or connector modules. The PCB 120 may be configured to receive and route image sensor control signals, such as from one or more processor(s) external to the imager assembly 100, to the image sensor 320 via the molded package 110. The PCB may further be configured to receive and route autofocus (AF) control signals, such as from an autofocus controller or other processor, to the VCM 130 via the molded package 110 (e.g., via bond pads 300 and electrical contacts 210) to enable autofocus of the imager module 100 by moving the lens 120.

Figure 5:
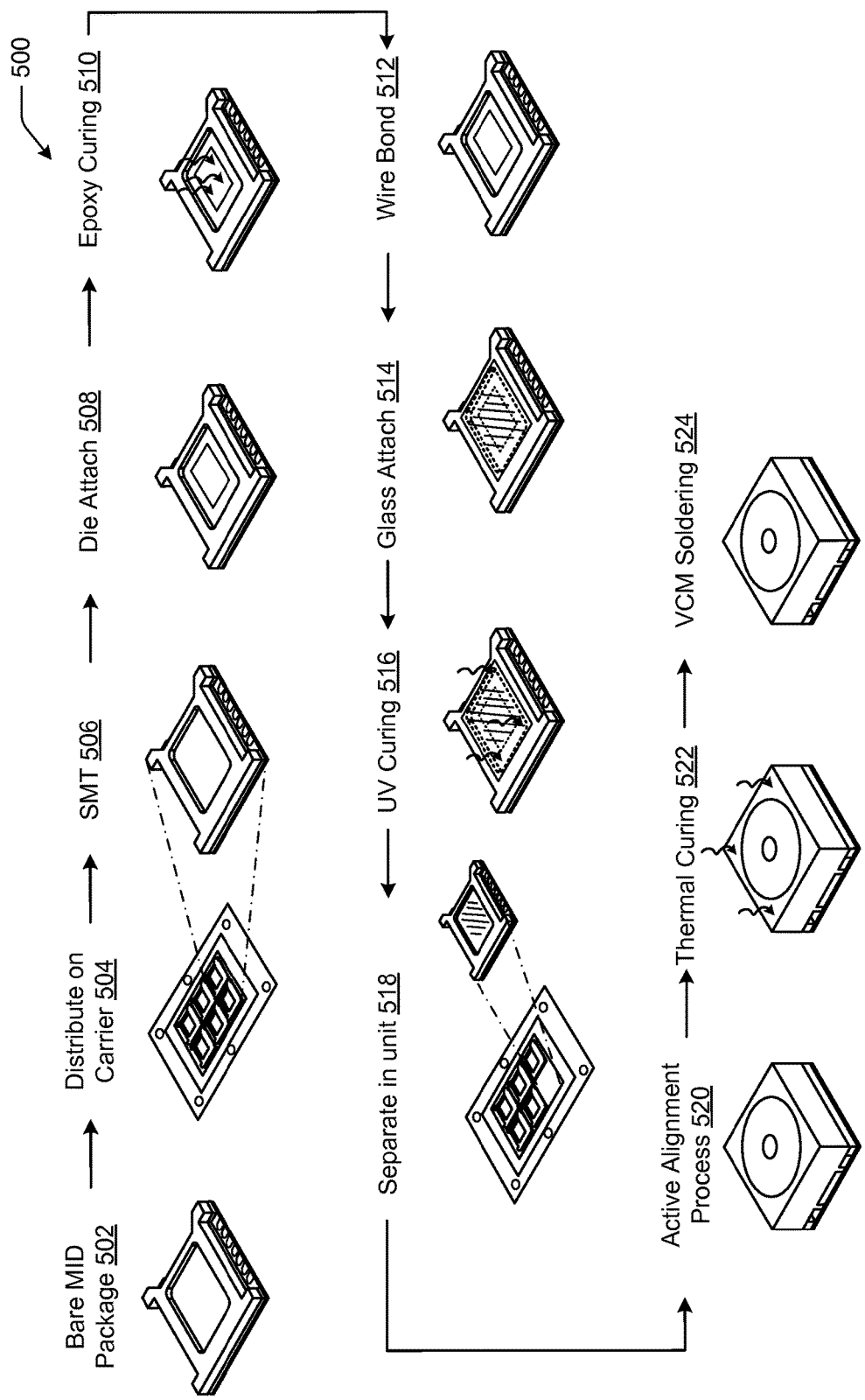
FIG. 5 is a flow diagram of an example method for fabricating the imager assembly with molded package of FIG. 1, in accordance with example embodiments of the disclosure.

FIG. 5 is a flow diagram of an example method 500 for fabricating the imager assembly 100 with molded package 110 of FIG. 1, in accordance with example embodiments of the disclosure. At 502, bare molded package 110 may be provided. The bare molded package 110 may be formed by the MID/LDS process as described above. This molded package 110 fabrication may entail an injection molding process using impregnated thermoplastic materials (e.g., thermoplastic material doped with a metal-plastic additive that can be activated by impingent laser radiation) that are suitable for injection molding. After the injection molding process, a laser may be used to write the paths of electrical traces on the molded package 110. The surface portions of the injection molded part that have laser light impingent thereon may be micro-roughened, partially ablated, and/or otherwise have the metal-plastic dopants activated. The laser activation process may be a physical-chemical process that may form metallic nucleation sites on the surface of the injection molded part on the portions written by the laser. Next a metal plating process, such as a reductive plating process may be initiated. The metallic plating may occur only in the portions of the surface of the injection molded part that has been activated such that there are plating nucleation sites. As a non-limiting example, electroless Cu plating may be used to form the intended traces and bond pads of the molded package 110. Other plating materials and/or chemical baths may include Sn, Ag, Pd/Au, etc. The surface roughening due to the laser activation may further result in enhancing the adhesion strength of the plated metal on the doped thermoplastic molded package 110. Therefore, the circuitry (e.g. traces and bond pads) of the molded package 110 may be written by a laser on to the surface of the injection molded intermediary part.

At 504, a plurality of molded packages may be provided on a carrier to enable batch processing. The carrier may also provide a level of rigidity and/or ease of handling the molded packages 110 that may enhance yield and/or reduce manufacturing complexities. The carrier may be specially sized to hold a predetermined number of the parts. Although six molded packages 110 are depicted, it will be appreciated that any suitable number of molded packages 110 may be processed at the same time.

At 506, an SMT process may be performed to attach SMDs to the molded package. The SMDs 306 may be attached using any suitable process, such as surface mount technology (SMT). The SMDs 306 may be any variety of discrete devices, integrated circuits, passive devices, and/or active devices. The SMDs 306 may include, but are not limited to, resistors, inductors, capacitors, diodes, transistors, logic gates, microcontrollers, microprocessors, application specific integrated circuits, digital signal processors, amplifiers, analog circuits, digital circuits, combinations thereof, or the like. The SMDs 306 may be attached to the MID package 110 using any suitable mechanism, including, for example, SMT, solder processes on in-line (e.g., dual in-line, quad in-line, etc.) packages, ball grid arrays (BGAs), or the like.

In example embodiments, where SMDs 306 are disposed on the MID package 110, an optional molding may be disposed on top of the SMDs 306. The molding may provide a substantially planer surface on top of the SMDs 306 attached on the MID package 110. The molding may be made of thermosetting polymer materials, in example embodiments. In example embodiments, a transfer molding process may be performed, where thermosetting polymer materials may be deposited on the surface (e.g., the surface of the MID package 110 and SMDs 306). In example embodiments, the molding may be templated so as to leave open bond pads on the surface of the MID package 110 to make electrical contact with the VCM 130. In some embodiments, if a molding process is used, then it may be performed after the attaching and wire bonding of the image sensor 320.

At 508, a die attach process may be performed to attach the image sensor to the molded package. The image sensor 320 may be aligned, such as by a pick-and-place process performed by a pick-and-place system, to where it is to be placed on the MID package 110. The image sensor 320 may be attached to the MID package using epoxy, in example embodiments. In some cases, epoxy may be deposited where the image sensor is to be attached on the MID package 110 prior to the pick-and-place or active alignment process. There may be markings on the MID package 110 that aids the pick-and-place systems in aligning the image sensor 320 on to the MID package 110. The image sensor 320 may be aligned such that light passing through the lens 120 impinges on one or more photopixels of the image sensor 320.

At 510, an epoxy cure may be performed to cure the epoxy used to attach the image sensor to the molded package. The cure process (e.g., thermal and/or ultraviolet (UV) cure) may be used to cure (e.g., crosslink and/or harden) the epoxy used to attach the image sensor 320 to the MID package 110. At 512, a wire bonding process may be performed to electrically connect the image sensor to the molded package. This may be performed by a wire bonding tool. Low profile wire bonds 330 may be used to keep the form factor of the overall imager assembly 100 low. At 514, a glass attach process may be performed to attach the lens to the molded package. This attachment may use an epoxy. At 516, a UV curing process may be performed after the lens is attached to the molded package. At 518, the molded package may be separated from the carrier to which it was attached at process 504.

At 520, an active alignment process may be used to align the VCM to the molded package. This may be performed by a pick-and-place tool. Epoxy may be deposited prior to aligning the VCM 130 for attachment to the MID package 110. At 522, a thermal cure may be performed to attach the VCM to the molded package. At 524, a soldering process may be performed to electrically connect the contacts of the VCM to the corresponding bond pads of the molded package.

Figure 6:
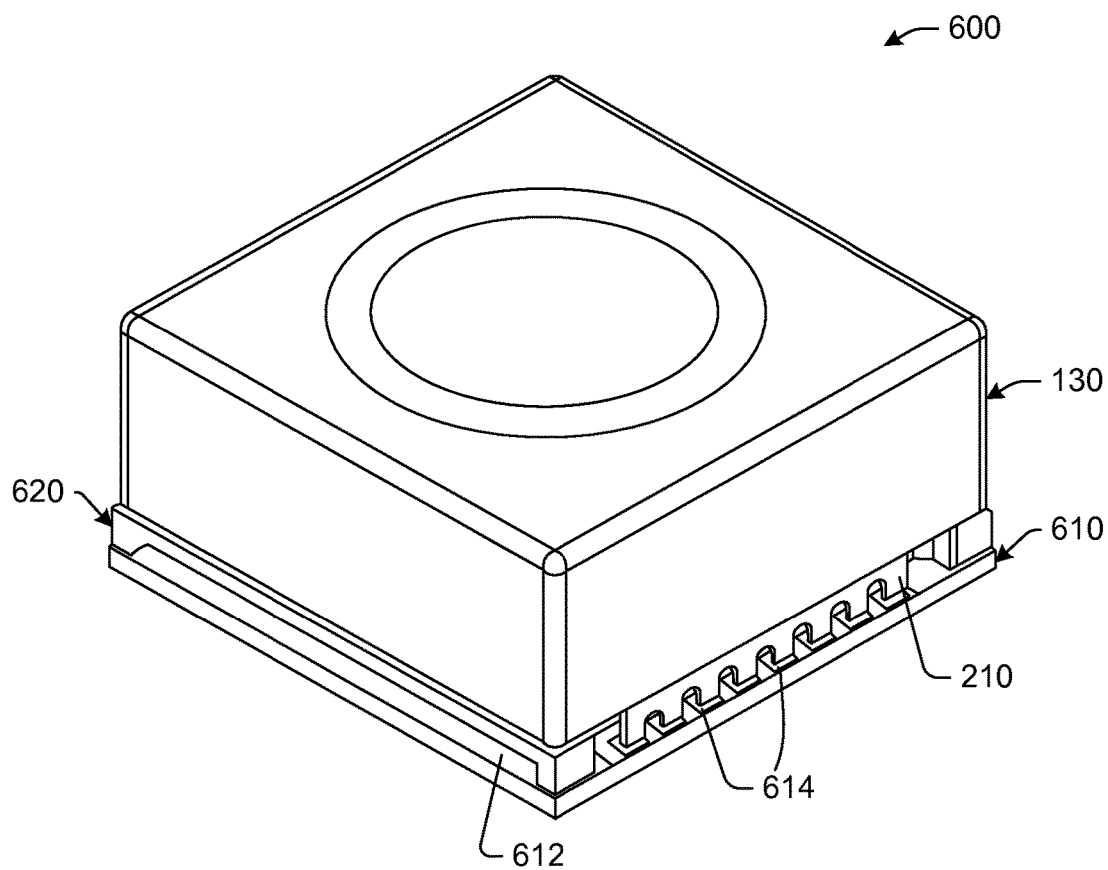
FIG. 6 is a schematic diagram illustrating a top perspective view of another example imager assembly with a molded package, in accordance with example embodiments of the disclosure.

FIG. 6 is a schematic diagram illustrating a top perspective view of another example imager assembly 600 with a molded package 610, in accordance with example embodiments of the disclosure. This molded package 610 may be formed using a sandwich molding technique and may have SMDs disposed within the molding material. The molded package 610 may have a first surface or substrate 612 with bond pads 614 disposed thereon. These bond pads 614 may be utilized in exchanging electrical signals (e.g., VCM control signals, VCM positional status signals, etc.) with the VCM 130, such as via the electrical connections 210 of the VCM 130. The molded package 610 may further have a lens holder assembly 620 disposed thereon, between the molded package 610 and the VCM 130.

The sandwich molded (SM) package 610 may be formed using a first substrate 612, such as a first high density interconnect (HDI) tape with metallic interconnects, a second substrate, such as a second HDI tape with metallic interconnects, surface mount technology devices (SMDs) disposed between the first substrate tape and the second substrate, through electrical connections from the first substrate to the second substrate, and molding material (e.g., thermoplastic, thermosetting plastic, etc.) disposed between the first substrate and the second substrate. The first surface 612 of the molded package 610 may be the first substrate 612 or the first HDI tape 612 with electrical patterns, such as electrical traces and bond pads 614 thereon. The SM package 610, in some example embodiments, may have all of the imager module SMDs (e.g., active devices, passive devices, EPROMs, gyroscopes, accelerometers, MEMS, microcontrollers, etc.) incorporated within the sandwich mold of the SM package 610. As a result, all or a substantial portion of the functionality of the imager assembly 600 may be integrated within the SM package-based imager assembly 600.

The SM packaging substrate 610, in some example embodiments, may be attached directly onto a main board of a user device in which the imager assembly 600 is to be provided. By having a highly integrated package using the SM package 610, thereby avoiding a daughter board or a imager module board, reduced costs and/or reduced form factors may be realized for the user device in which the SM package 610 based imager assembly 600 is to be incorporated.

The VCM 130 may be mechanically coupled to the lens assembly 620 and electrically coupled to the SM package 610, such as via bond pads 614, and may be configured to receive one or more autofocus (AF) control signals or VCM control signals and move the lens assembly 620 based at least in part on the received AF control signals. Any suitable mechanism may be used for joining components onto the SM package 610, such as flip-chip, thermo-sonic bonding, thermo-compression bonding, solder bonding, wire bond, ACP, non-conductive paste (NCP), wedge bonding, combinations thereof, or the like. The VCM 130 may be electrically coupled by electrical contacts 210 to the SM package 610, in example embodiments, on a side opposite the side on which the imager assembly 600 is to be attached to a PCB of a user device. The VCM 130 may be electrically coupled by electrical contacts 210 to the SM package 610, in example embodiments, on the same side the SM package 610 on which an image sensor is disposed and electrically coupled. It will be appreciated that while the lens assembly 120 autofocus is described with relation to the VCM 130, any suitable electromechanical device that may be used to displace the lens assembly 130 may be used. Other electromechanical devices may include piezo-motors, MEMS based deflectors, or the like.

Figure 7:
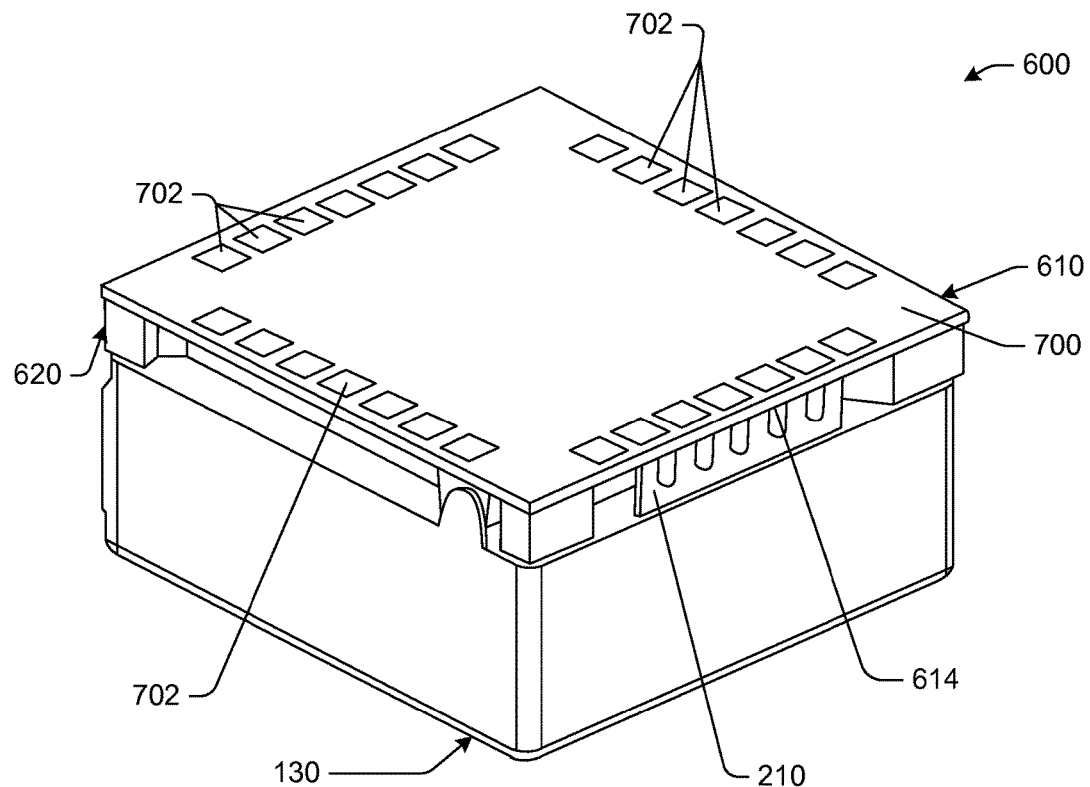
FIG. 7 is a schematic diagram illustrating a bottom perspective view of the example imager assembly with the molded package of FIG. 6, in accordance with example embodiments of the disclosure.

FIG. 7 is a schematic diagram illustrating a bottom perspective view of the example imager assembly 600 with the molded package 610 of FIG. 6, in accordance with example embodiments of the disclosure. The molded package 610 may have a second side 700 that may be the second substrate 700 with electrical patterns, such as electrical traces and bond pads 702 thereon.

The bond pads 702 are depicted along the edge of the second substrate 700 of the SM package 610, but the bond pads 702 may be disposed at any suitable location on the second side 700 of the SM package 610. The bond pads 702 may be configured to make electrical contact to a PCB or motherboard of a user device in which the imager assembly 600 is to be provided. The bond pads 702 may be configured to make any suitable connection to a PCB, such as ball grid array (BGA), wire bond, anisotropic conductive paste (ACP), non-conductive paste (NCP), Au/Au bonds, solder bonds, combinations thereof, or the like. The bond pads 702 may provide the function of communicating electrical signals, such as image sensor signals (e.g., image sensor data), image sensor control signals (e.g., signal to capture an image), VCM/AF control signals, other SMT control signals, to and/or from the imager assembly 600. For example, the bond pads 702 connected to interconnects on the SM package 610 may be configured to fan out and provide signals/data from an image sensor to an application processor of a user device in which the imager assembly 600 is disposed and operational. In other words, the bond pads 702 may serve as a conduit via which the imager assembly 600 may be configured to communicate with any variety of control or other devices off-module from the imager assembly 600, including at least image sensor signals, VCM signals, or the like.

Figure 8:
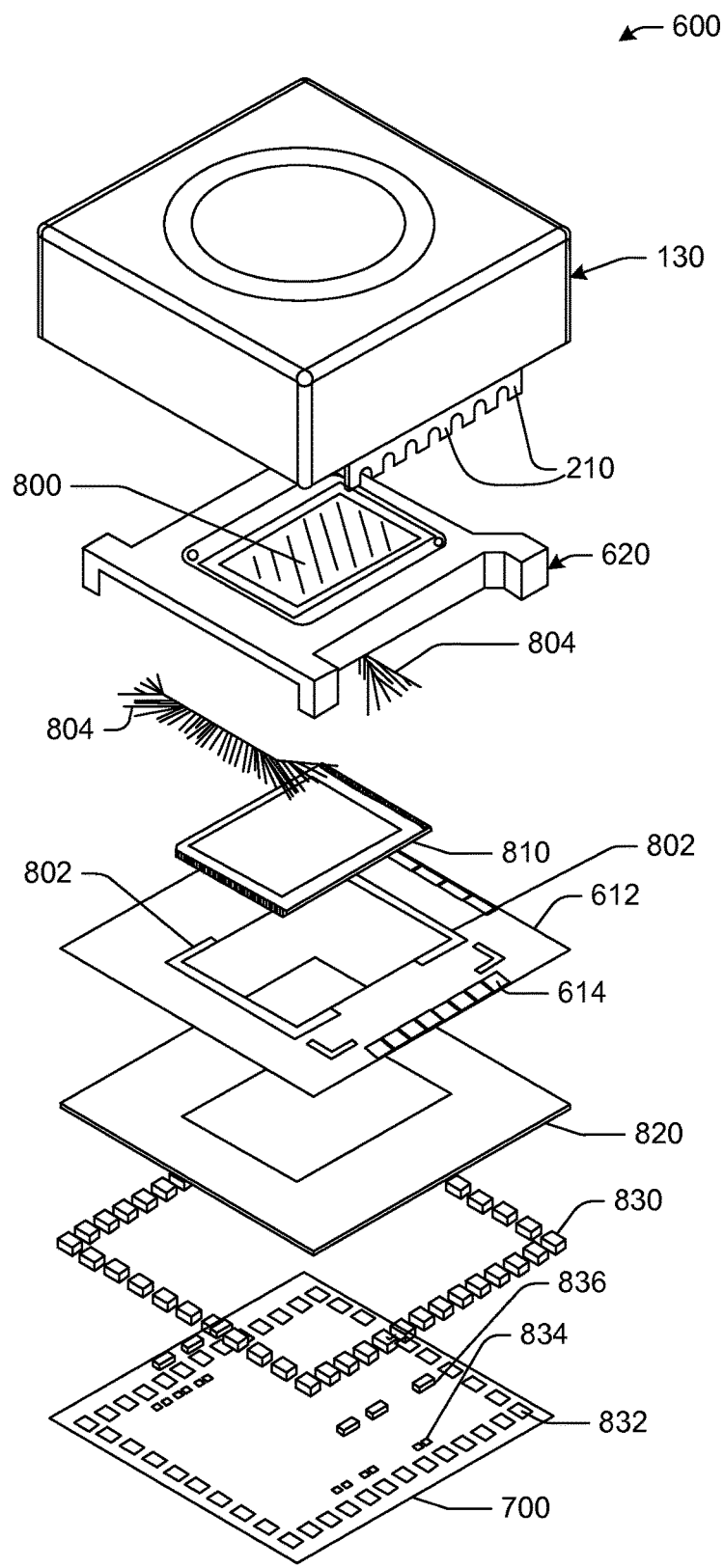
FIG. 8 is a schematic diagram illustrating an exploded perspective view of the example imager assembly with the molded package of FIGS. 6 and 7, in accordance with example embodiments of the disclosure.

FIG. 8 is a schematic diagram illustrating an exploded perspective view of the example imager assembly 600 with the molded package 610 of FIGS. 6 and 7, in accordance with example embodiments of the disclosure. The second substrate 700 may have a first plurality of bond pads 832 and a second plurality of bond pads 834 patterned thereon. These the first set of bond pads 832 may provide for electrical connections via metal pillars 830 between the first substrate 612 and the second substrate 700. In other words, the metal pillars 830 disposed between the first substrate 612 and the second substrate 700 my make contact to corresponding metal bond pads on the first substrate and corresponding metal bond pads 832 on the second substrate 700. The imager assembly may further include one or more SMDs 836 disposed between and electrically attached to the bond pads 834 of the second substrate 700. It will be understood that the SMDs 836 may be attached to either the first substrate 612 or the second substrate 700 of the sandwich molded package 610, in accordance with example embodiments of the disclosure. In fact, as will be depicted in conjunction with FIG. 11, either the first substrate 612 or the second substrate 700 may be a starting substrate onto which the metal pillars 830 and the SMDs 836 may be attached first.

The region between the first substrate 612 and the second substrate 700 may further include molding material 820. The molding material 820 may be fabricated by providing a molding compound from the edges of the stack of the first substrate 612 and the second substrate 700. The molding compound may wick into the space between the first substrate 612 and the second substrate 700, surrounding the SMDs 836 and the metal pillars 830. Upon curing, the molding compound may harden to form the molding material 820 disposed between the first substrate 612 and the second substrate 700. The molding material may be a thermosetting polymer material, in example embodiments. In example embodiments, the molding material may be introduced from the edges of the first substrate 612 and the second substrate 700. The molding material may be cured to form the molding. This cure may be a UV cure and/or thermal cure. After the cure the thermoset polymer material may harden (e.g., crosslink) to form the molding 820. The molding 820 may provide a substantially complete gap fill between the first substrate 612 and the second substrate 700.

An image sensor 810 may be attached to the first substrate 612. This attachment may be using an epoxy, such as an epoxy that can be cured and hardened. The image sensor 810 may be attached to the first substrate 612 in a manner such that photosensitive elements (e.g., photopixels of the image sensor 810 may be positioned to receive light from the lens assembly 620 having a lens 800 thereon. The image sensor 810, once attached to the first substrate may be electrically connected to the SM package 610 and the first substrate 612, in particular, such as by using wire bonding 804. Electrical contact pads on the image sensor 810 may be wire bonded using the wire bonds 804 to micro-pads 802 provided on the surface of the first substrate 612 of the SM package 610.

The image sensor 810 may be of any suitable type, such as active-pixel, charge coupled device (CCD), complementary metal-oxide-semiconductor (CMOS), or the like. The image sensor 810 may be of any suitable pixel count and/or aspect ratio. For example, the image sensor 810 may have an aspect ratio of 4:3 and have 10 Megapixels. When an image is captured by the image sensor 810, an image signal corresponding to the captured image may be generated. This image signal may represent the intensity and/or color of each of the pixels of the captured image. Each of the pixels of the captured image may correspond to photosensitive pixels of the image sensor 810 in an active region of the image sensor 810. Light from the scene to be imaged may pass through the lens assembly 620 to impinge upon the photosensitive pixels of the image sensor 810.

The lens assembly 620 may include one or more optical elements 800, such as one or more lenses 800 and/or mirrors. In some example embodiments, the lens assembly 620 may include a single lens 800. The lens assembly 620 and/or lenses therein may be moved (e.g., displaced from a quiescent point) by the VCM 130. The lens assembly 620 may be mechanically attached to the SM package 610, by any suitable mechanism, including, for example epoxy material. The lens assembly 620 may be aligned, such as by a pick-and-place process performed by a pick-and-place system, over the image sensor 810 or by using markings on the top substrate 612. The lens assembly 620, in example embodiments, may be configured to collect and direct light from an object to be imaged by the imager module 110 to the image sensor 810. In example embodiments, the lens assembly 620 may be attached to the molded package 610 in a manner to allow light to pass therethrough and imping on the image sensor 810, particularly on photosensitive elements of the image sensor 810. In this way, light from an object to be imaged may be focused by the lens assembly 620 for clear imaging (e.g., focused) by the image sensor 810. VCM control signals that control the VCM to move the lens assembly 620 and/or the lens 800 therein may be generated by an entity external to the imager assembly 600, such as an autofocus (AF) controller of a user device in which the imager assembly 600 is disposed.

An active alignment process may be used to align and place the VCM 130, or any other electromechanical device, on top of the lens assembly 620. The VCM 130 may be mechanically coupled to the lens assembly in addition to the molded package 610 and may be configured to move the lens assembly, such as based at least in part on VCM control signals received by the VCM via electrical contacts 210. The active alignment process to place the VCM 130 in alignment on top of the lens assembly 620 may be any suitable process, such as a pick-and-place process performed using pick-and-place tools. The VCM 130 may be placed in a manner such that the electrical contacts 210 of the VCM 130 may be in contact with bond pads 614 on the first substrate 612 of the SM package 610. As seen here, the electrical contacts 210 of the VCM 130 may be on the outside of a frame of the lens assembly 620 and the corresponding bond pads 614 may not be obscured by the lens assembly 620.

Figure 9:
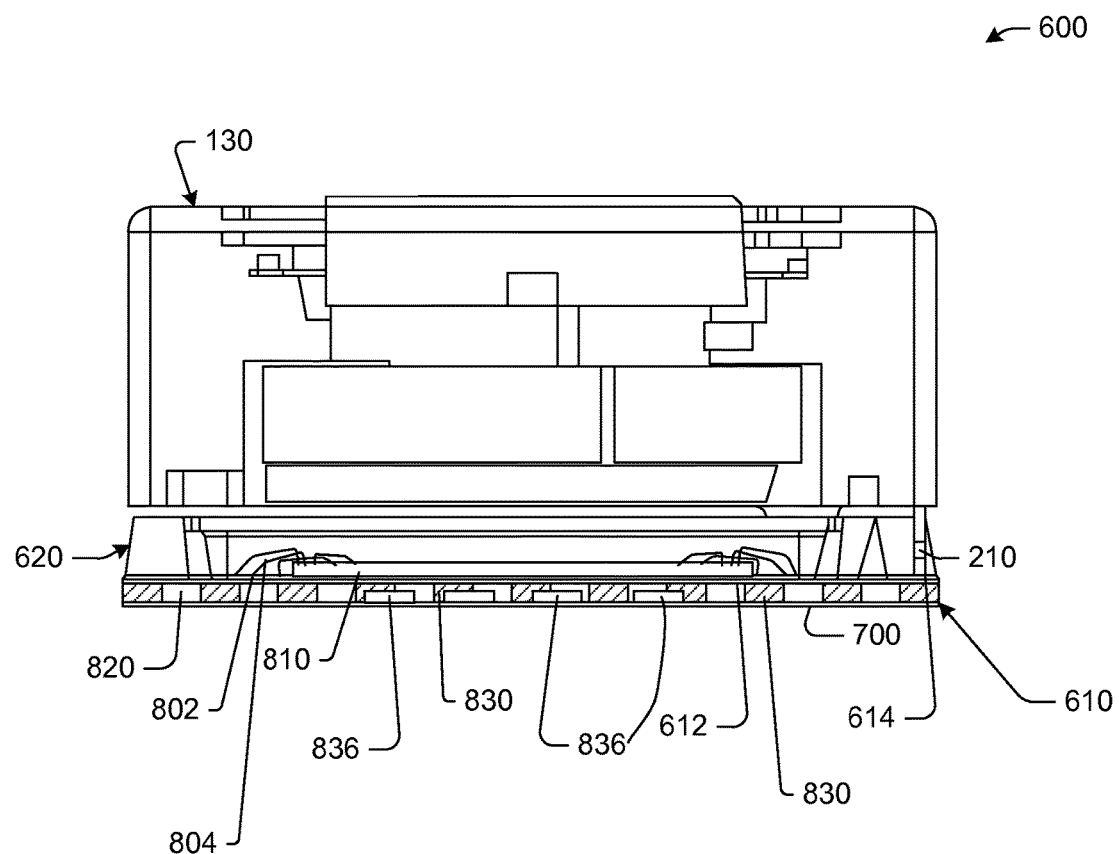
FIG. 9 is a schematic diagram illustrating a sectional view of the example imager assembly of FIGS. 6 and 7, in accordance with example embodiments of the disclosure.

FIG. 9 is a schematic diagram illustrating a sectional view of the example imager assembly 600 of FIGS. 6 and 7, in accordance with example embodiments of the disclosure. In this example embodiment, the image sensor 810 may sit on top of the first substrate 612 of the SM package 610. The image sensor 810 form this location may be electrically connected to the SM package 610 by wire bonds 804 connected to corresponding bond pads 802 on the SM package 610. In cross-sectional view, it can be seen that the SMDs 836 integrated between the first substrate 612 and second substrate 700 may be integrated either under the image sensor 810, on the periphery of the image sensor 810, or both under and on the periphery of the image sensor. The connector components 830 may be distributed in a fashion such that there is sufficient mechanical stability and/or mechanical coupling between the first substrate 612 and the second substrate 700 during the fabrication of the SM package 610. It should be noted that the connector components 830 may provide both a mechanical coupling between the first substrate 612 and second substrate 700 as well as an electrical through connection between the two substrates 612, 700. In some cases, if an insufficient number of connector components 830 are needed for through connections, from the standpoint of providing mechanical support for the second substrate 700 atop the first substrate 612, then dummy connector components 830 may be used. In example embodiments, the dummy connector components 830 may be used for the purposes of improved manufacturability and even distribution of mechanical support structures during manufacture, rather than any electrical through connection functionality.

Figure 10:
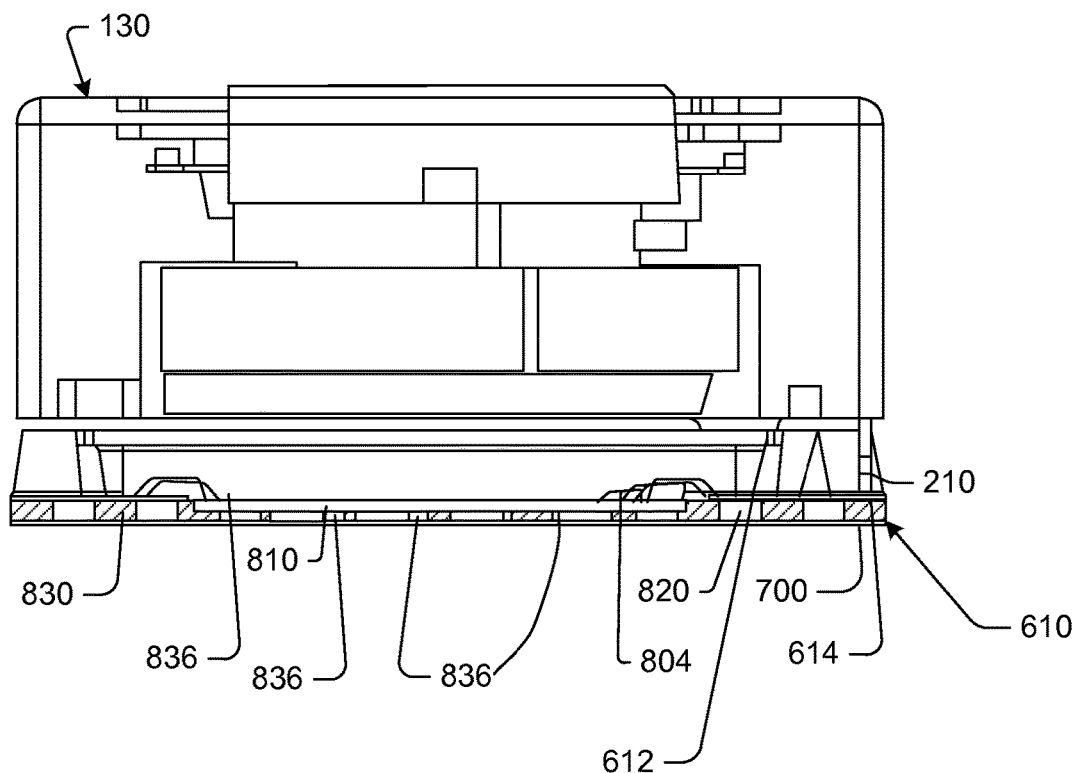
FIG. 10 is a schematic diagram illustrating a sectional view of the example imager assembly of FIGS. 6 and 7 with a cavity within the molded package where the image sensor is disposed, in accordance with example embodiments of the disclosure.

FIG. 10 is a schematic diagram illustrating a sectional view of the example imager assembly 600 of FIGS. 6 and 7 with a cavity 1000 within the molded package 610 where the image sensor is disposed, in accordance with example embodiments of the disclosure. This embodiment may be similar to the imager assembly of FIG. 9, except the image sensor 810 may be inset in the cavity 1000 within the top substrate 612. The formation of this cavity 1000 may entail a removal of material of the top substrate 612. In other words, prior to the assembly of the SM package 610, the first substrate 612 may have a hole cut in it where the image sensor 810 may be inset. Alternatively, the hole may be formed by any variety of subtractive processes after the formation of the SM package 610.

Figure 11:
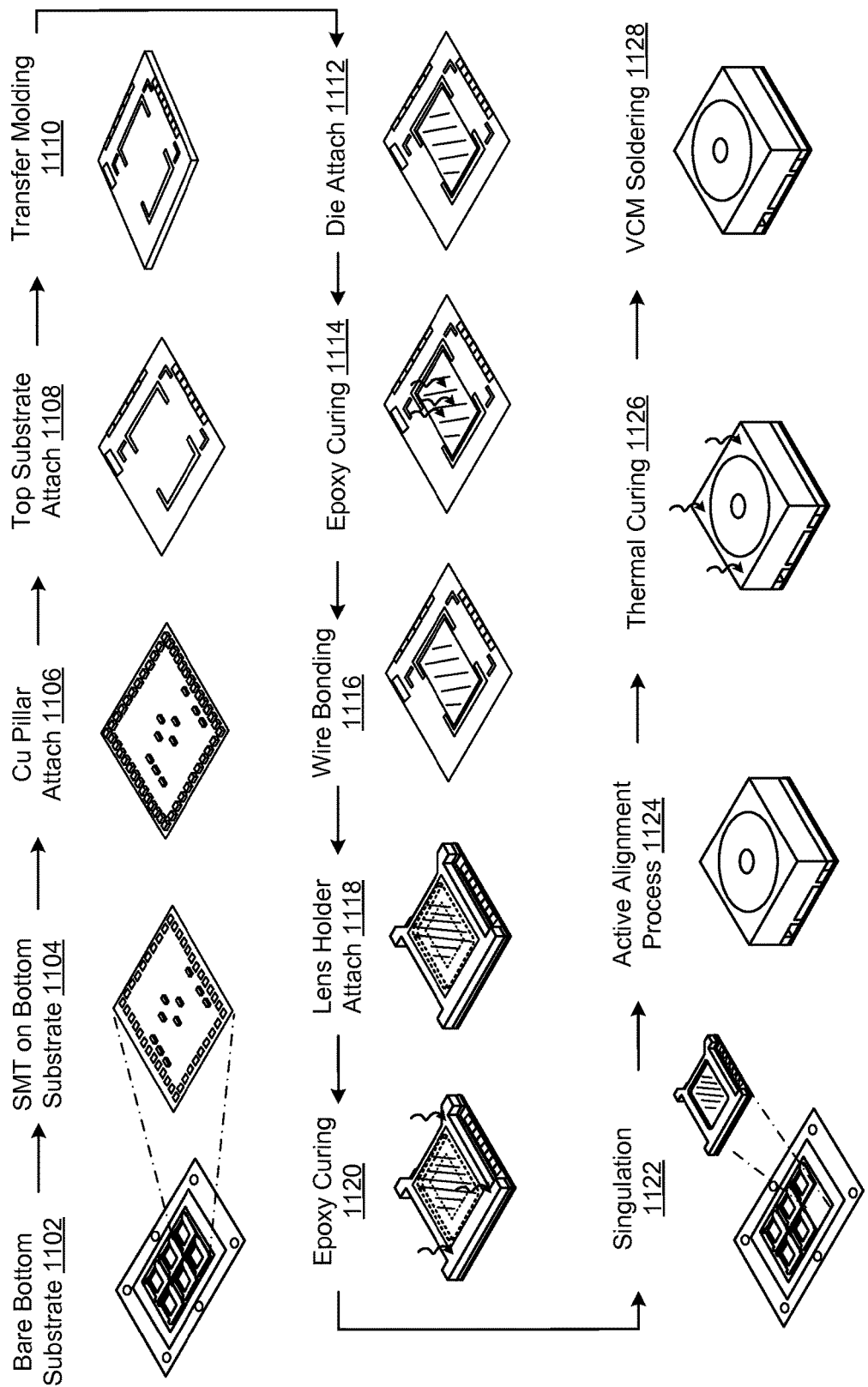
FIG. 11 is a flow diagram of an example method for fabricating the imager assembly with molded package of FIG. 6, in accordance with example embodiments of the disclosure

FIG. 11 is a flow diagram of an example method 1100 for fabricating the imager assembly 600 with molded package 610 of FIG. 6, in accordance with example embodiments of the disclosure. At 1102, a bottom substrate, or first substrate may be placed in a carrier. The bottom substrate 612, 700 may be relatively flexible. For example these substrates 612, 700 may be HDI tape. As a result, the bottom substrate 612, 700 may be placed on a rigid carrier for processing. In addition, a vacuum pull-down may be utilized to provide a flat surface during processing of the bottom substrate. It will further be appreciated that either the first substrate 612 or the second substrate 700 may be the bottom substrate from the standpoint of this method 1100. Indeed, one of the two substrates 612, 700 are to be a starting substrate (e.g., the bottom substrate). It will be appreciated that metallic traces and/or any variety of bond pads may be formed on the bottom substrate 612, 700 prior to starting the method 1100. The substrates 612, 700 may have been patterned with electrical traces and/or bond pads using any variety of suitable processes, such as, for example, using a template etch process and/or screen printing techniques.

At 1104, a SMT process may be performed to attach the SMDs to the bottom substrate. The SMDs 836 may be any variety of discrete devices, integrated circuits, passive devices, and/or active devices. The SMDs 836 may include, but are not limited to, resistors, inductors, capacitors, diodes, transistors, logic gates, microcontrollers, microprocessors, application specific integrated circuits, digital signal processors, amplifiers, analog circuits, digital circuits, combinations thereof, or the like. The SMDs 836 may be attached to the bottom substrate 612, 700 using any suitable mechanism, including, for example, SMT, solder processes on in-line (e.g., dual in-line, quad in-line, etc.) packages, ball grid arrays (BGAs), or the like. The SMT process to attach the SMDs 836 on the bottom substrate 612, 700 may be performed by pick-and-place techniques with screen printed solder paste on the appropriate bond pads 834. Alignment marks may be patterned on the surface of the bottom substrate to enable gross and/or fine alignment by the pick-and-place machines to attach the SMDs 836 to the bottom substrate 612, 700.

At 1106, metallic pillars, such as Cu pillars, may be attached to the bottom substrate. This process may also be performed, in example embodiments, using a pick-and-place system, similar to the process of SMD 836 attach of 1104. Cu pillars 830 may be picked up, in example embodiments, by the pick-and-place systems and placed on the appropriate bond pads 832. The bond pads 832 may have solder paste disposed thereon to make contact, such as intermetallic or eutectic contact between the Cu pillars 830 and the corresponding bond pads 832. There may be markings on the bottom substrate 612, 700 that aid the pick-and-place tools place the Cu pillars 830 within spatial tolerances needed to yield the SM package 610.

At 1108, the top substrate may be attached onto the bottom substrate with the Cu pillars and SMDs disposed thereon. This process may be accomplished by aligning the top substrate 700, 612 to the bottom substrate 612, 700 and placement on top of the Cu pillars 830 provided on top of the bottom substrate 612, 700 at 1106.

At 1110 a transfer molding process may be performed to provide molding compound between the bottom substrate and the top substrate. The molding process may provide a premeasured amount of molding compound. The molding compound may be introduced from the edge(s) of the substrates 612, 700 and may wick in between the substrates 612, 700. The wicking action may be driven by Van der Waals forces. The molding compound may be specially formulated to have affinity to the surfaces of the substrates 612, 700 to enhance the wicking action therebetween. For example, in some example embodiments, the molding compound may be relatively hydrophilic.

At 1112, a die attach process may be performed. The image sensor 810 may be aligned, such as by a pick-and-place process performed by a pick-and-place system, to where it is to be placed on the SM package 610. The image sensor 810 may be attached to the MID package using epoxy, in example embodiments. In some cases, epoxy may be deposited where the image sensor is to be attached on the SM package 610 prior to the pick-and-place or active alignment process. There may be markings on the SM package 610 that aids the pick-and-place systems in aligning the image sensor 810 on to the SM package 610. The image sensor 810 may be aligned such that light passing through the lens assembly 620 impinges on one or more photopixels of the image sensor 810.

At 1114, an epoxy cure may be performed to cure the epoxy used to attach the image sensor to the molded package. The cure process (e.g., thermal and/or ultraviolet (UV) cure) may be used to cure (e.g., crosslink and/or harden) the epoxy used to attach the image sensor 810 to the SM package 610. At 1116, a wire bonding process may be performed to electrically connect the image sensor to the molded package. This may be performed by a wire bonding tool. Low profile wire bonds 804 may be used to keep the form factor of the overall imager assembly 600 low. At 1118, a lens holder attach process may be performed to attach the lens holder to the molded package. This attachment may use an epoxy. At 1120, an epoxy curing process may be performed after the lens holder is attached to the molded package. At 1122, the molded package may be separated from the carrier to which it was attached at process 1102.

At 1124, an active alignment process may be used to align the VCM to the molded package. This may be performed by a pick-and-place tool. Epoxy may be deposited prior to aligning the VCM 130 for attachment to the SM package 610. At 1126, a thermal cure may be performed to attach the VCM to the molded package. At 1128, a soldering process may be performed to electrically connect the contacts of the VCM to the corresponding bond pads of the molded package.

Figure 12:
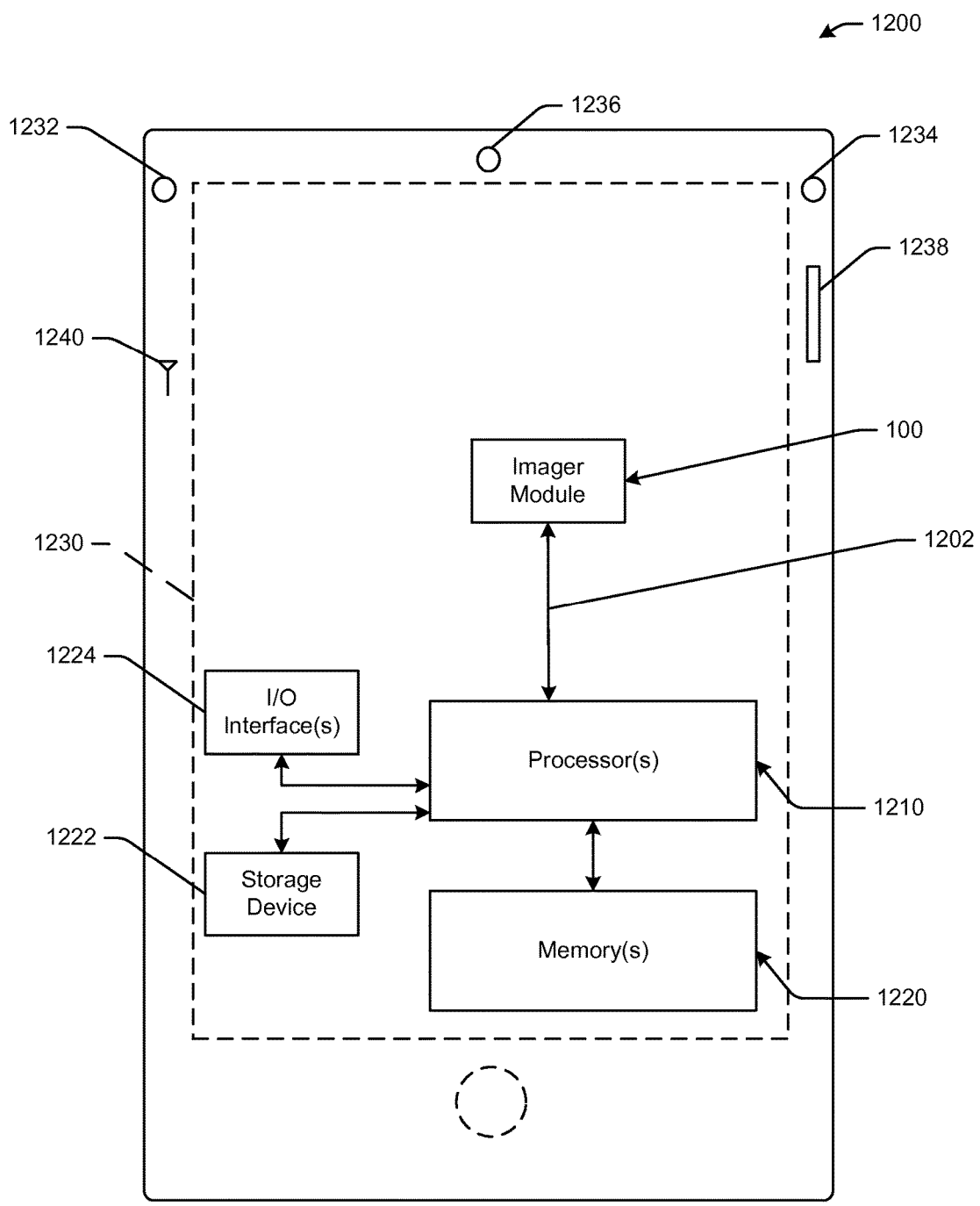
FIG. 12 is a block diagram illustrating an example user device with an imager module, in accordance with example embodiments of the disclosure.

FIG. 12 is a schematic diagram illustrating an example user device 1200 with an imager module 100, 600 in accordance with example embodiments of the disclosure. In operation, the user device 1200 may include computer-readable and computer-executable instructions that reside on the user device 1200, as is discussed further below. The user device 1200 may include an address/data bus 1202 for conveying data among components of the user device 1200. Each component within the computing device 102 may also be directly connected to other components in addition to (or instead of) being connected to other components across the bus 1202.

The imager module 100, 600 may be included within the user device 1200, such as a mobile communications device, a personal electronic device, an imaging system, or any device that may have camera functionality. Indeed, the user device 1200 may be any one of suitable devices that may be configured to capture images. The user device 1200 may include, but is not limited to, a personal computer, a desktop computer, a notebook computer, a laptop computer, a personal digital assistant, an electronic book (ebook) reader, a tablet computing device, a pad computing device, a smartphone, wearable devices, or combinations thereof. The user device 1200 may include one or more application processor(s) 1210 and/or memory 1220 to control and/or direct the capture of image(s) by the imager module 100, 600 and receive image signal(s) corresponding to captured image(s) by the imager module 100, 600.

In some example embodiments, the processors 1210 of the user device 1200 may be implemented as appropriate in hardware, software, firmware, or combinations thereof. Software or firmware implementations of the processors 1210 may include computer-executable or machine-executable instructions written in any suitable programming language to perform the various functions described. Hardware implementations of the processors 1210 may be configured to execute computer-executable or machine-executable instructions to perform the various functions described. The one or more processors 1210 may include, without limitation, a central processing unit (CPU), a digital signal processor (DSP), a reduced instruction set computer (RISC), a complex instruction set computer (CISC), a microprocessor, a microcontroller, a field programmable gate array (FPGA), or any combination thereof. The user device 1200 may also include a chipset (not shown) for controlling communication between the one or more processors 1210 and one or more of the other components of the user device 1200. The one or more processors 1210 may also include one or more application specific integrated circuits (ASICs) or application specific standard products (ASSPs) for handling specific data processing functions or tasks.

The memory/storage 1220 may include one or more volatile and/or non-volatile memory devices including, but not limited to, random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read only memory (EEPROM), non-volatile RAM (NVRAM), universal serial bus (USB) removable memory, non-volatile magnetoresistive (MRAM), or combinations thereof.

The memory 1220 may store program instructions that are loadable and executable on the processor(s) 1210, as well as data generated or received during the execution of these programs. The memory 1220 may include one or more operating systems (O/S) and one or more application software that may be executed by the processors 1210 to control the user device 1200 and the imager module 100, 600. The memory 1220 may also provide temporary "working" storage at runtime for any applications being executed on the processors(s) 1210. The computer instructions may be stored in a non-transitory manner in non-volatile memory 1220, storage 1222, or an external device. Alternatively, some or all of the executable instructions may be embedded in hardware or firmware in addition to or instead of software.

The user device 1200 may include input/output device interfaces 1224. A variety of components may be connected through the input/output device interfaces 1224, such as a display or display screen 1230 having a touch surface or touchscreen, an audio output device for producing sound, such as speaker(s) 1232, one or more audio capture device(s), such as a microphone or an array of microphones 1234, one or more image and/or video capture devices, such as the imager module 100, 600, one or more haptic units 1238, and other components. The display 1230, speaker(s) 1232, microphone(s) 1234, imager module 100, 600, haptic unit(s) 1238, and other components may be integrated into the user device 1200 or may be separate.

The display 1230 may be a video output device for displaying images. The display 1230 may be a display of any suitable technology, such as a liquid crystal display, an organic light emitting diode display, electronic paper, an electrochromic display, a cathode ray tube display, a pico-projector or other suitable component(s). The display 1230 may also be implemented as a touchscreen and may include components such as electrodes and/or antennae for use in detecting stylus input events or detecting when a stylus is hovering above, but not touching, the display 730.

The input/output device interfaces 1224 may also include an interface for an external peripheral device connection such as universal serial bus (USB), FireWire, Thunderbolt, Ethernet port or other connection protocol that may connect to one or more networks. The input/output device interfaces 1224 may also include a connection to antenna 1240 to connect one or more networks via a wireless local area network (WLAN) (such as WiFi) radio, Bluetooth, and/or wireless network radio, such as a radio capable of communication with a wireless communication network such as a Long Term Evolution (LTE) network, WiMAX network, 3G network, etc.

The processor(s) 1210, by executing instructions stored in the memory 1220 and/or storage device 1222 may be configured to control the operations of the imager module 100, 600, as described above. In particular, the processor(s) 1210 may be configured to provide the imager module 100, 600 with one or more control signals via a PCB and molded package 110, 610 to the VCM 130. The processor(s) 1210 may further be configured to cause the image sensor 320, 620 of the imager module 100, 600 to capture an image and further receive, process, display, such as on the display screen 1230, and/or store, such as in memory 1220 or storage device 1222, the image data.

Various other changes and modifications to the embodiments herein chosen for purposes of illustration will readily occur to those skilled in the art. Further additional intervening layers may be able to be provided while still benefiting from the explained embodiments. Examples were described to aid in understanding. Thus, it was not intended that these examples were the only examples. To the extent that such modifications and variations do not depart from the spirit of the invention, they are intended to be included within the scope thereof. It will be readily understood to those skilled in the art that various other changes in the details, material, and arrangements of the parts and method stages which have been described and illustrated in order to explain the nature of this disclosure may be made without departing from the principles and scope of the disclosure.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

That which is claimed:

1. A camera module comprising:
a molded electronics substrate with a top side and an opposing bottom side, wherein the top side includes a first set of bond pads and a second set of bond pads and the second side includes a third set of bond pads, and wherein the molded electronic substrate includes a rim protruding from the top side and away from the bottom side and in a direction substantially orthogonal to the first side;
a lens that fits within the rim of the molded electronics substrate, wherein an edge of the lens contacts an inner sidewall of the rim;
an image sensor electrically coupled to the first set of bond pads and disposed such that one or more photosensitive pixels of the image sensor are configured to receive light through the lens; and
a voice coil motor (VCM) mechanically coupled to the lens and electrically coupled to the second set of bond pads, wherein the VCM is configured to move the lens relative to the image sensor,
wherein the molded electronics substrate is configured to receive a VCM control signal via the third set of bond pads and route the VCM control signal to the second set of bond pads, and wherein the VCM control signal actuates the VCM to move the lens relative to the image sensor.

2. The mobile device of claim 1, further comprising a fourth set of bond pads on second side, wherein the image sensor is configured to generate image data, and wherein the image data is sent from the image sensor over the fourth set of bond pads.

3. The mobile device of claim 1, further comprising a fourth set of bond pads on the first side, the fourth set of bonds pads electrically coupling one or more surface mount devices (SMDs) to the molded electronics substrate.

4. The mobile device of claim 1, wherein the molded electronics substrate further includes a via extending from the first side to the second side and wherein the VCM control signal is routed through the via.

5. A method, comprising:
forming a molded electronics substrate having a first side and a second side opposite the first side, wherein the first side includes a first set of bond pads and a second set of bond pads and the second side includes a fourth set of bond pads, and wherein the molded electronics substrate includes a rim protruding from the first side in a direction substantially orthogonal to the first side;
attaching an image sensor onto the first side;
electrically coupling the image sensor to the first set of bond pads;
providing a lens that fits within the rim of the molded electronics substrate; and
attaching an electromechanical device to the molded electronics substrate and electrically coupling the electromechanical device to the second set of bond pads, the electromechanical device configured to move the lens based on a control signal, wherein the fourth set of bond pads are configured to receive the control signal and route the control signal to the second set of bond pads.

6. The method of claim 5, wherein the molded electronics substrate further includes a third set of bond pads on the first side and the method further comprises attaching one or more surface mount devices (SMDs) to the third set of bond pads.

7. The method of claim 5, wherein forming the molded electronic package further comprises:
injection molding an intermediary molded electronics substrate;
laser scribing the intermediary molded electronic package; and
immersing the intermediary molded electronic package in an electroless plating bath.

8. The method of claim 5, further comprising forming electrical connections between the first side and the second side of the molded electronics substrate, wherein the electrical connections are through the molded electronics substrate.

9. The method of claim 5, further comprising forming wrap-around peripheral connections between the first side and a second side of the molded electronics substrate, the second side opposing the first side.

10. The method of claim 5, further comprising attaching a printed circuit board (PCB) to the molded electronic substrate on a second side opposing the first side and configured to route the control signal to the electromechanical device via the molded electronic substrate.

11. The method of claim 5, wherein electrically coupling the image sensor to the first set of bond pads further comprises wire bonding image sensor bond pads on the image sensor to the first set of bond pads.

12. The method of claim 5, further comprising:
forming a notch on an inner sidewall of the rim, wherein the lens rests on the notch in the rim.

13. An imager module, comprising:
a molded electronics substrate with a first side, an opposing second side, and a rim protruding from the first side and away from the second side and in a direction substantially orthogonal to the first side;
an image sensor electrically coupled to the molded electronics substrate on the first side, the image sensor configured to receive light and generate image sensor data corresponding to the light;
a lens disposed on the molded electronics substrate and configured to pass light onto the image sensor; and
an electromechanical device mechanically coupled to the lens and electrically coupled to the first side, wherein the image module is configured to receive a control signal at the second side and route the control signal to the first side.

14. The imager module of claim 13, further comprising a printed circuit board (PCB) electrically coupled to the molded electronics substrate and configured to route control signals to the electromechanical device via the molded electronics substrate.

15. The imager module of claim 14, wherein the second side includes one or more first bond pads to receive the control signals and the first side has one or more second bond pads electrically coupled to the electromechanical device to route the control signals to the electromechanical device.

16. The imager module of claim 13, wherein the molded electronics substrate is configured to route image sensor data from the image sensor to the second side of the molded electronics substrate.

17. The imager module of claim 13, wherein the molded electronics substrate includes a set of bond pads on the first side, the set of bonds pads electrically coupling one or more surface mount devices (SMDs) to the molded electronics substrate.

18. The imager module of claim 13, wherein the rim has a notch on an inner sidewall of the rim, wherein the lens rests on the notch in the rim.

19. The imager module of claim 13, wherein a total height of the imager module, from the second side of the molded electronics substrate to a top of the electromechanical device, is about 6 millimeters or less.

20. The imager module of claim 13, wherein the molded electronics substrate further includes a wrap-around connection from the first side to the second side.

* * * * *